United States Patent
Kitano et al.

(10) Patent No.: US 6,599,366 B1
(45) Date of Patent: Jul. 29, 2003

(54) SUBSTRATE PROCESSING UNIT AND PROCESSING METHOD

(75) Inventors: Takahiro Kitano, Kumamoto (JP); Shinji Kobayashi, Kumamoto (JP); Yukihiko Esaki, Kumamoto (JP); Masateru Morikawa, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 150 days.

(21) Appl. No.: 09/711,968

(22) Filed: Nov. 15, 2000

(30) Foreign Application Priority Data

Nov. 16, 1999 (JP) .......................... 11-325504

(51) Int. Cl.[7] .............................................. B05C 11/06
(52) U.S. Cl. ........................ 118/666; 118/50; 118/59; 118/63; 118/64
(58) Field of Search .................. 118/56, 712, 710, 118/695, 50, 63, 64, 66, 500, 666, 667, 59; 34/588, 585, 558

(56) References Cited

U.S. PATENT DOCUMENTS

| | | | |
|---|---|---|---|
| 5,919,332 A | * 7/1999 | Koshiishi et al. | ........ 118/723 E |
| 5,964,947 A | * 10/1999 | Zhao et al. | .................. 118/715 |
| 5,976,256 A |   11/1999 | Kawano | |
| 6,009,827 A | * 1/2000 | Robles et al. | ............. 118/723 E |
| 6,143,128 A | * 11/2000 | Ameen et al. | ............... 118/719 |
| 6,263,587 B1 | * 7/2001 | Raaijmakers et al. | ......... 34/404 |
| 6,423,642 B1 | * 7/2002 | Peace et al. | ................. 118/900 |

FOREIGN PATENT DOCUMENTS

| | | | | |
|---|---|---|---|---|
| TW | 353199 | 2/1999 | | |
| WO | WO 98/53484 | * 11/1998 | ........... | H01L/21/00 |

* cited by examiner

*Primary Examiner*—Richard Crispino
*Assistant Examiner*—George R. Koch, III
(74) *Attorney, Agent, or Firm*—Rader, Fishman & Grauer PLLC

(57) ABSTRACT

The present invention includes a current plate which is arranged above a substrate in a chamber. A pressure inside the chamber is reduced by exhaust means and drying processing is performed on, for example, a coating solution on the substrate. On a peripheral portion of an underneath surface of the current plate, formed is a ring-shaped protrusion corresponding to a peripheral portion of the substrate. A protruding portion of a coating solution at the peripheral portion of the substrate is made flat by air current generated when the pressure is reduced, and consequently a coating film with a uniform film thickness as a whole is formed on the substrate.

12 Claims, 12 Drawing Sheets

SUBSTRATE PROCESSING UNIT AND PROCESSING METHOD

BACKGROUND OF THE INVENTION

1. Field of the Invention

The present invention relates to a substrate processing unit and a processing method.

2. Description of the Related Art

In the photolithography in processes of semiconductor device fabrication, for example, resist coating treatment for applying a resist solution to the surface of a wafer to form a resist film, exposure processing for exposing a pattern on the wafer, developing treatment for developing the exposed wafer, and the like are performed to form a predetermined circuit pattern on the wafer.

At present, a spin coating method is in the mainstream as a method of applying the resist solution in the above-described resist coating treatment. According to the spin coating method, the resist solution is discharged to the center of the wafer and the wafer is rotated. This allows the resist solution applied on the wafer to spread by centrifugal force, whereby a uniform resist film can be formed over the entire face of the wafer. Thereafter, heating is performed in a heat treatment unit to dry a solvent in the applied resist solution.

SUMMARY OF THE INVENTION

However, in the spin coating method, the wafer is rotated at high speed, whereby a large amount of resist solution scatters from the peripheral portion of the wafer, which results in a big waste of resist solution. Moreover, the unit is contaminated by the scatter of the resist solution, thereby causing harmful effects such as necessity for frequent cleaning.

Therefore, instead of the spin coating method in which the wafer is rotated, a method, in which a nozzle for discharging the resist solution and the wafer are moved relative to each other to apply the resist solution having low viscosity, for example, evenly on the wafer in lattice form, is conceivable.

However, also in such method of applying the resist solution in the manner of the so-called single stroke, there is a fear that a resist film is not uniformly formed since the resist solution applied at the peripheral portion of the wafer protrudes by surface tension. Even if exposure is performed with the resist film protruding at the peripheral portion, the peripheral portion becomes a defective portion which can not be used as a product, thereby decreasing yields correspondingly.

On the other hand, it is considered that the resist solution having relatively low viscosity is suitable in the case of the method in which the resist solution is applied in the manner of the so-called single stroke, whereby there is a fear that evaporation rate becomes too high to form unevenness on the resist film if heating at high temperature is performed after coating as in the conventional method.

Therefore, although it is considered to be preferable that the solvent in the resist solution is slowly dried by reducing a pressure inside the unit to dry it after the resist solution is applied on the wafer, thereafter it is necessary to pay attention to uniformity of air current on a surface portion of the wafer and the above-described protruding portion of the resist solution at the peripheral portion of the wafer.

The present invention is made in view of the aforesaid points and its object is to make a film thickness of a coating solution such as the resist solution uniform by, for example, controlling the generated air current to remove protuberance formed at the outer peripheral portion of a substrate by surface tension when processing such as drying the solvent in the resist solution after application of the resist solution is performed.

According to a first aspect of the present invention, a substrate processing unit for performing predetermined processing on a substrate in a processing section after applying a coating solution to the substrate comprises exhaust means for reducing a pressure inside the unit, and a current plate for rectifying air current generated in the processing section due to exhaust by the exhaust means, which is arranged above the substrate, an underneath surface of the current plate having a protrusion which protrudes downward compared with other portions thereof corresponding to an outer peripheral portion of the substrate.

According to a second aspect of the present invention, a substrate processing unit for performing predetermined processing on a substrate in a processing section after applying a coating solution to the substrate comprises exhaust means for reducing a pressure inside the unit, and a current plate for rectifying air current generated in the processing section due to exhaust by the exhaust means, which is arranged above the substrate, an underneath surface of the current plate being flat and besides a distance between the underneath surface thereof and a treated surface of the substrate being 0.5 mm to 2.0 mm.

According to a third aspect of the present invention, a substrate processing unit for performing predetermined processing on a substrate in a processing section after applying a coating solution to the substrate comprises exhaust means for reducing a pressure inside the unit, and a current plate for rectifying air current generated in the processing section due to exhaust by the exhaust means, which is arranged above the substrate, an underneath surface of the current plate being flat and besides surface roughness of the underneath surface thereof being 0.2 $\mu$m or less.

According to a fourth aspect of the present invention, a substrate processing unit for performing predetermined processing on a substrate in a processing section after applying a coating solution to the substrate comprises exhaust means for reducing a pressure inside the unit, a current plate for rectifying air current generated in the processing section due to exhaust by the exhaust means, which is arranged above the substrate, and a heating device for heating a peripheral portion of the current plate.

According to a fifth aspect of the present invention, a substrate processing unit for performing predetermined processing on a substrate in a processing section after applying a coating solution to the substrate comprises exhaust means for reducing a pressure inside the unit, and a current plate for rectifying air current generated in the processing section due to exhaust by the exhaust means, which is arranged above the substrate, a peripheral portion of an underneath surface of the current plate having a color which is lower in lightness than that of other portions thereof.

According to a sixth aspect of the present invention, a substrate processing method of performing predetermined processing on a substrate in a processing section after applying a coating solution to the substrate comprises the steps of reducing a pressure inside the processing section, measuring the pressure inside the processing section by pressure measuring means, and performing drying processing of the coating solution on the substrate by changing pressure reduction speed when the measured value of the pressure exceeds a predetermined value.

According to a seventh aspect of the present invention, a substrate processing method of performing predetermined processing on a substrate in a processing section after applying a coating solution to the substrate comprises the steps of reducing a pressure inside the processing section, measuring an amount of change in pressure inside the processing section, and performing drying processing of the coating solution on the substrate by changing pressure reduction speed when the amount of change in pressure exceeds a predetermined value.

According to an eighth aspect of the present invention, a substrate processing method of performing predetermined processing on a substrate in a processing section after applying a coating solution to the substrate comprises the steps of covering above of the substrate with a current plate of which underneath surface is flat, and reducing a pressure inside the processing section, wherein an area of a portion which is uniform in film thickness of a coating film by the coating solution on the substrate is controlled by adjusting a distance between the current plate and a top surface of the substrate.

According to the present invention, predetermined processing is performed under reduced pressure and, in particular, the present invention has a great effect on drying of the coating solution on the substrate. In addition, since the current plate for rectifying air current generated in the processing section is provided and the underneath surface of the current plate has a the protrusion which protrudes downward compared with the other portions thereof corresponding to the outer peripheral portion of the substrate, even if there is a protruding portion of the coating solution at the peripheral portion of the substrate, the protruding portion is made low by flow of the air current when a pressure is reduced, and consequently a coating solution film which is uniform as a whole is formed on the substrate.

According to the present invention, even if the underneath surface of the current plate is flat, a distance between the underneath surface thereof and the treated surface of the substrate is appropriately set, thereby improving the uniformity in film thickness of the solution film of the coating solution on the substrate.

According to the present invention, the underneath surface of the current plate is flat and besides the underneath surface thereof is set smooth, thereby preventing turbulence from occurring and improving the uniformity in film thickness of the solution film of the coating solution on the substrate.

According to the present invention, a heating device for heating a peripheral portion of the current plate is provided, thereby promoting vaporization of the solvent in the coating solution at the peripheral portion of the substrate and improving the uniformity in film thickness of the solution film of the coating solution.

According to the present invention, a peripheral portion of the underneath surface of the current plate has a color which is lower in lightness than that of other portions thereof, that is, a deep color, thereby promoting vaporization of the solvent in the coating solution at the peripheral portion of the substrate and improving the uniformity in film thickness of the solution film of the coating solution.

According to the present invention, drying processing of the coating solution on the substrate can be performed under appropriate reduced pressure by changing pressure reduction speed, which is effective in promoting drying.

According to the present invention, it is possible to control an area of a portion which is uniform in film thickness of the coating film by the coating solution on the substrate by adjusting the distance between the current plate and the top surface of the substrate.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENT

Figure 1:
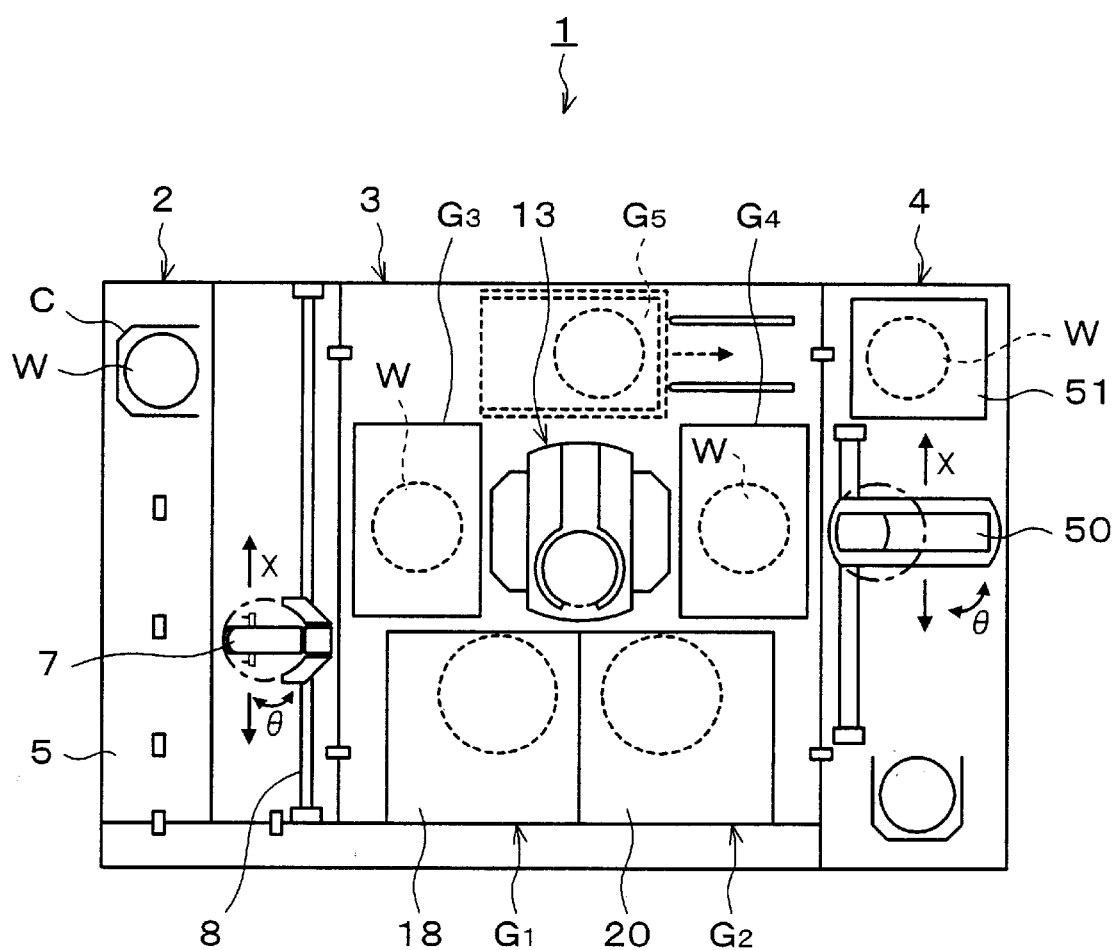
FIG. 1 is a plane view showing an appearance of a coating and developing system provided with a unit according to embodiments.
Figure 2:
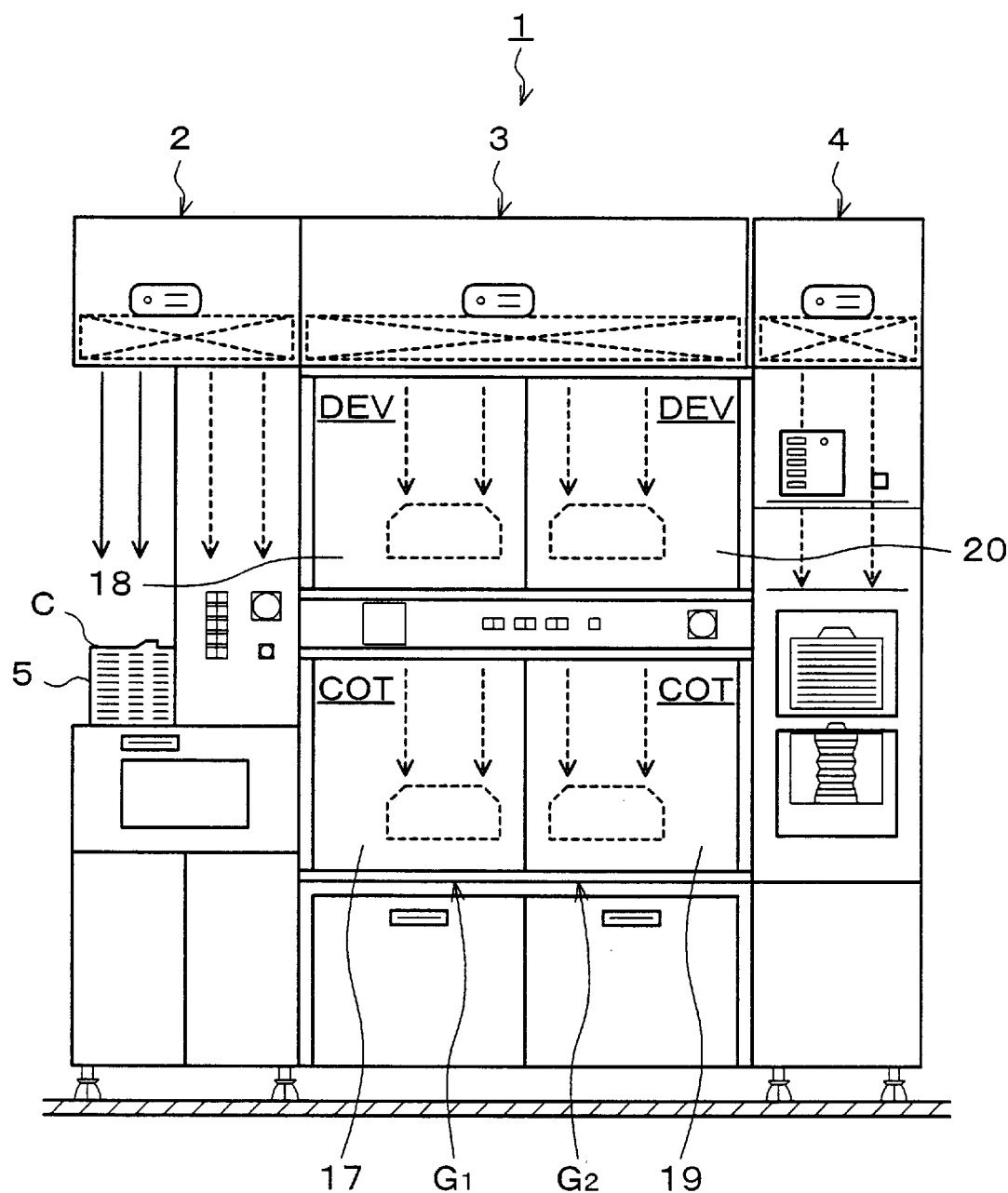
FIG. 2 is a front view of the coating and developing system in FIG. 1.
Figure 3:
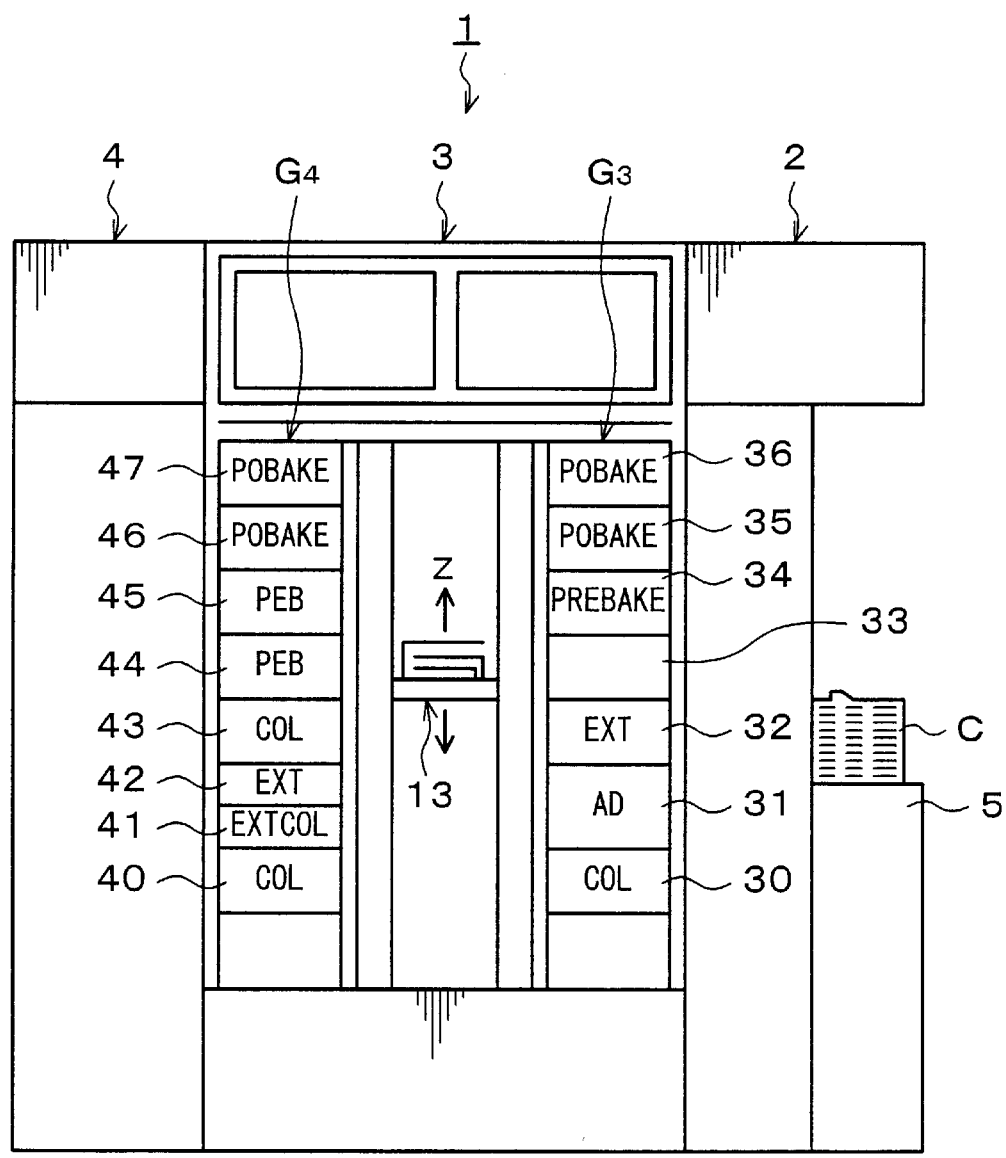
FIG. 3 is a rear view of the coating and developing system in FIG. 1.

Some preferred embodiments of a reduced-pressure drying unit as a processing unit which is the present invention will be described hereinafter. FIG. 1 is a plane view of a coating and developing system 1 having a reduced-pressure drying unit according to the present embodiments, FIG. 2 is a front view of the coating and developing system 1, and FIG. 3 is a rear view of the coating and developing system 1.

As shown in FIG. 1, the coating and developing system 1 has a structure in which a cassette station 2 for carrying, for example, 25 wafers from/to the outside to/from the coating and developing system 1 in the unit of cassette and for carrying the wafers W into/from a cassette C, a processing station 3 in which various kinds of multi-tiered processing units for performing predetermined processing one by one in the coating and developing process are disposed, and an interface section 4 for receiving and delivering the wafer W from/to an aligner which is not shown provided adjacent to the processing station 3, are integrally connected.

In the cassette station 2, a plurality of cassettes C are well mounted at predetermined positions on a cassette mounting table 5 serving as a mounting section in a line in an X-direction (a vertical direction in FIG. 1). Further, a wafer carrier 7, which is transferable in the direction of alignment of the cassettes (the X-direction) and in the direction of alignment of the wafers W housed in the cassette C (a Z-direction; a vertical direction), is provided to be movable along a carrier guide 8 and is selectively accessible to the respective cassettes C.

The wafer carrier 7 has an alignment function for aligning the wafer W. The wafer carrier 7 is structured so as to access also an extension unit 32 included in a third processing unit group G3 on the side of the processing station 3 as will be described later.

In the processing station 3, a main carrier unit 13 is provided in the center part thereof, and various kinds of processing units are multi-tiered on the periphery of the main carrier unit 13 to compose processing unit groups. In the coating and developing system 1, there are four processing unit groups G1, G2, G3 and G4, and the first and the second processing unit groups G1, G2 are disposed on the front side of the coating and developing system 1, the third processing unit group G3 is disposed adjacent to the cassette station 2, and the fourth processing unit group G4 is disposed adjacent to the interface section 4. Further, as an option, a fifth processing unit group G5 depicted by broken lines can be additionally arranged on the rear side of the coating and developing system 1.

In the first processing unit group G1, for example, a resist coating unit 17 for applying a resist solution to the wafer W and a developing unit 18 for performing treatment on the wafer W with a developing solution supplied are two-tiered in the order from the bottom as shown in FIG. 2. Also in the case of the second processing unit group G2, a resist coating unit 19 and a developing unit 20 are similarly two-tiered in the order from the bottom.

Here, although a spin-type method, in which the resist solution is applied while the wafer W is rotated, is employed in the resist coating units 17 and 19 conventionally, so-called single-stroke-type resist coating units, in which the wafer W and a mounting table for placing the wafer W thereon move relative to each other to apply the resist solution, are employed in the present embodiments from the view points of reducing an amount of application of the resist solution, saving labor in cleaning the units and so on.

In the third processing unit group G3, for example, as shown in FIG. 3, a cooling unit 30 for cooling the wafer W, an adhesion unit 31 for increasing the fixability between the resist solution and the wafer W, the extension unit 32 for keeping the wafer W waiting, a reduced-pressure drying unit 33 according to the present embodiments for initially drying a solvent in the resist solution, prebaking unit 34 for subsequently drying the residual solvent in the resist solution, and postbaking units 35, 36 for performing heat treatment after developing treatment and so on are, for example, seven-tiered in the order from the bottom.

In the fourth processing unit group G4, for example, a cooling unit 40, an extension and cooling unit 41 for spontaneously cooling the placed wafer W, an extension unit 42, a cooling unit 43, post-exposure baking units 44, 45 for performing heat treatment after exposure processing, postbaking units 46, 47 and so on are, for example, eight-tiered in the order from the bottom.

In the center part of the interface section 4, provided is a wafer carrier 50. The wafer carrier 50 is structured so as to be movable in the X-direction (the vertical direction in FIG. 1) and the Z-direction (the vertical direction), and to be rotatable in a θ direction (a rotational direction about an axis Z), so that it can access the extension and cooling unit 41, the extension unit 42 which are included in the fourth processing unit group G4, a peripheral aligner 51, and the aligner which is not shown.

Figure 4:
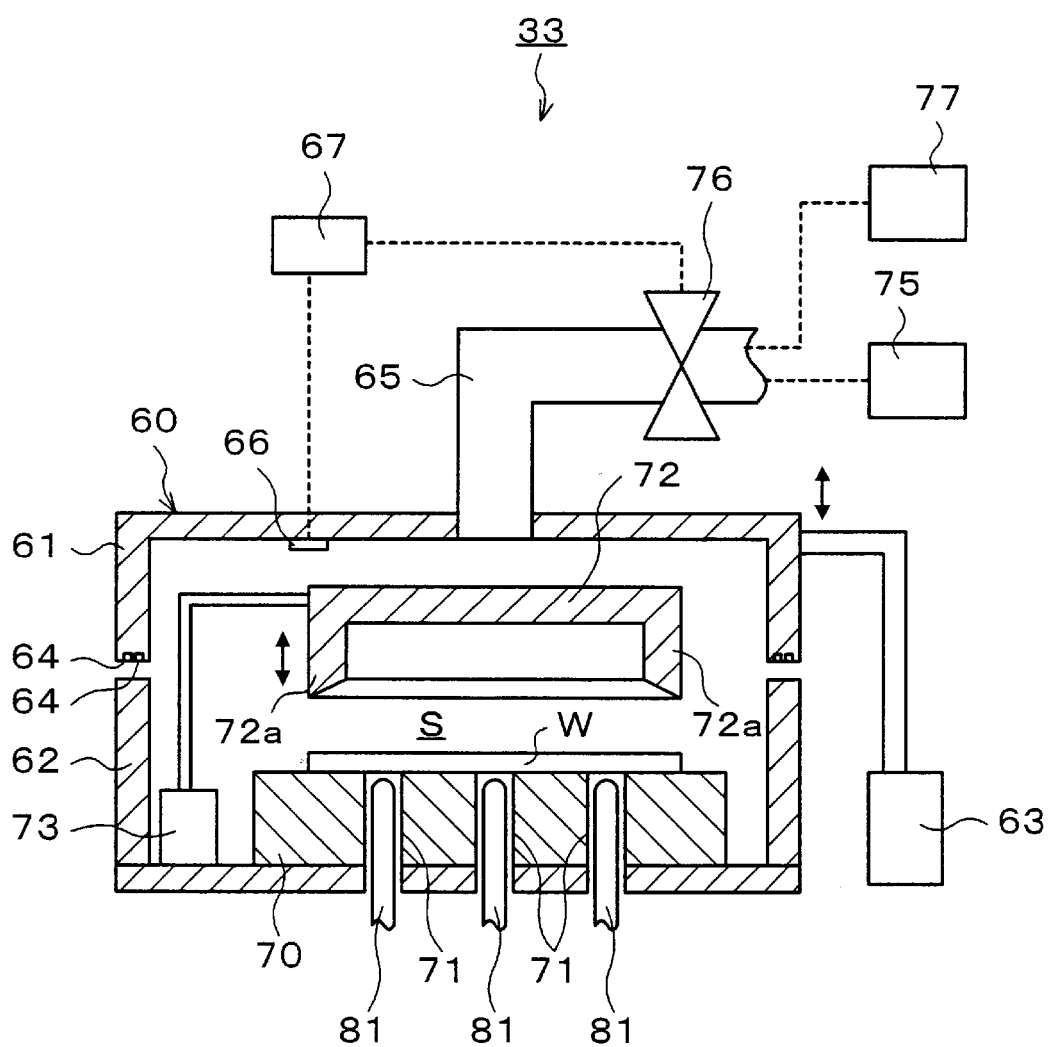
FIG. 4 is an explanatory view of a vertical cross section of a reduced-pressure drying unit according to a first embodiment.

A structure of the above-described reduced-pressure drying unit 33 will be explained in detail. First, as shown in FIG. 4, a chamber 60 in the reduced-pressure drying unit 33 is composed of, for example, a substantially cylindrical lid body 61 with its lower surface side opened, and a substantially cylindrical container 62 with its upper surface side opened. The outer shape of the lid body 61 is the same as that of the container 62. The lid body 61 is vertically movable by a lid body drive mechanism 63 in which, for example, a motor or the like is incorporated. Accordingly, a lower end portion of the lid body 61 and an upper end portion of the container 62 closely come into contact with each other so that a processing section S can be formed. O-rings 64 are provided outside and inside the lower end portion of the lid body 61, respectively, to maintain air-tightness since a pressure inside the processing section S is reduced during the processing.

Moreover, on the center of the top of the lid body 61, provided is an exhaust duct 65 for exhausting gas inside the processing section S, for example, when the pressure is reduced. Further, a pressure sensor 66 for measuring the pressure inside the processing section S is provided on an inner wall of the lid body 61 and measures the pressure inside the processing section S whenever necessary during the processing. A predetermined value is set in the pressure sensor 66 beforehand in such a manner that a saturated vapor pressure of the solvent in the resist solution applied on the wafer W is set at, for example, 0.2 KPa in the present embodiment. It is structured that the pressure sensor 66 sends a signal to a controller 67 when it detects the set value and the controller 67 controls a degree of opening and closing of a valve 76 described later.

The chamber 60 includes a mounting table 70 on which the wafer W is placed, and the mounting table 70 has a disk shape with a certain thickness. The mounting table 70 has a temperature control function, which sets a temperature in a range of at least 10° C. to 40° C. and can maintain distribution of temperature of the surface portion of the wafer W within ±0.2° C. Additionally, in the mounting table 70, (formed are three through-holes 71 through which hoisting and lowering pins 81 described later move.

Above the mounting table 70, provided is a current plate 72 for controlling a direction of air current generated when the pressure is reduced. The current plate 72 has, for example, a disk shape and its underneath surface protrudes downward compared with other portions thereof corresponding to a shape of the peripheral portion of the wafer W, to form a protrusion 72a. Therefore, the protrusion 72a is formed in the shape of a ring, whereby the current plate 72 has substantially cylindrical shape as a whole with its lower end portion opened. Further, a lower end portion of the protrusion 72a is bevel and the outside thereof is larger than the inside thereof in protruding length. Furthermore, the current plate 72 is provided with a drive mechanism 73 to be vertically movable and it is structured so as to be capable of vertically driving the current plate 72 a predetermined distance at predetermined timing. Accordingly, the current plate 72 is lowered and the protrusion 72a is brought close to the peripheral portion of the wafer W, thereby accelerating current speed at the peripheral portion of the wafer W, for example, during drying under reduced pressure.

The above-described exhaust duct 65 on the lid body 61 is connected to a suction unit 75 for sucking gas inside the chamber 60 to reduce the pressure therein, and a feeder 77 for supplying gas such as, for example, nitrogen gas that is inert gas to the inside of the chamber 60 to release the reduced pressure state after drying under reduced pressure is completed. A valve 76 for controlling a flow rate of the gas is attached to the exhaust duct 65. Therefore, the gas is sucked through the exhaust duct 65 by means of the suction unit 75, for example, when the pressure in the chamber 60 is reduced, and the nitrogen gas is supplied through the exhaust duct 65 to the inside of the chamber 60 by means of the feeder 77 when the reduced pressure state in the chamber 60 is released. In addition, pressure reduction speed or reduced pressure releasing speed at this time is changeable by controlling the degree of opening and closing of the valve 76.

The feeder 77 also performs a function of supplying the inert gas such as the nitrogen gas or the like to the inside of the chamber 60 after drying processing of the wafer W to purge an atmosphere inside the chamber 60. Moreover, the hoisting and lowering pins 81 for supporting the wafer W to raise and lower it when the wafer W is carried thereto/therefrom are provided to be freely raised and lowered through the through holes 71 by a drive mechanism which is not shown.

Next, a function of the reduced-pressure drying unit 33 as structured above will be described together with a photolithography process performed in the coating and developing system 1.

First, the wafer carrier 7 takes an unprocessed wafer W out of the cassette C to carry it into the adhesion unit 31 included in the third processing unit group G3. Then the wafer W, which is coated with an adhesion reinforcing agent such as HMDS therein, is carried to the cooling unit 30 by the main carrier unit 13 and cooled to a predetermined temperature. Thereafter, the wafer W is carried to the resist coating unit 17 or 19.

In the resist coating unit 17 or 19, a method of coating in a manner of so-called single stroke is employed as described above, and the resist solution, which has lower viscosity than that used in a conventional spin coating method, is also used. For this reason, it is not preferable to abruptly dry the resist solution applied to the wafer W at a high temperature in the prebaking unit as in the conventional method since bumping of the resist solution or the like is caused thereby. Therefore, the reduced-pressure drying unit 33, in which the resist solution is gradually dried, is provided so that the wafer W coated with the resist solution in the resist coating unit 17 or 19 is initially carried to the reduced-pressure drying unit 33 and thereafter carried to the prebaking unit 34.

Then the wafer W, which is dried in the prebaking unit 34, is carried to the cooling unit 40 by the main carrier unit 13. The wafer W subsequently undergoes a series of predetermined processing and treatment such as exposure processing, developing treatment and the like, and coating and developing treatment is completed.

The above-described function of the reduced-pressure drying unit 33 will be explained in detail. First, the wafer W, which is coated with the resist solution in the resist coating unit 17 or 19, is carried into the chamber 60 by the main carrier unit 13. At this time, the lid body 61 is raised by the lid body drive mechanism 63 and the wafer W is delivered to the hoisting and lowering pins 81 which are raised by the not shown drive mechanism and keep waiting in advance. The hoisting and lowering pins 81 are lowered and the wafer W is placed on the mounting table 70 of which temperature is controlled to 23° C. by the temperature control function thereof. Here, although the resist solution can be dried at a predetermined speed by maintaining the mounting table 70 at 23° C., the temperature is raised when it is desired to dry it more quickly, and the temperature is lowered when it is desired to dry it more slowly.

Figure 5:
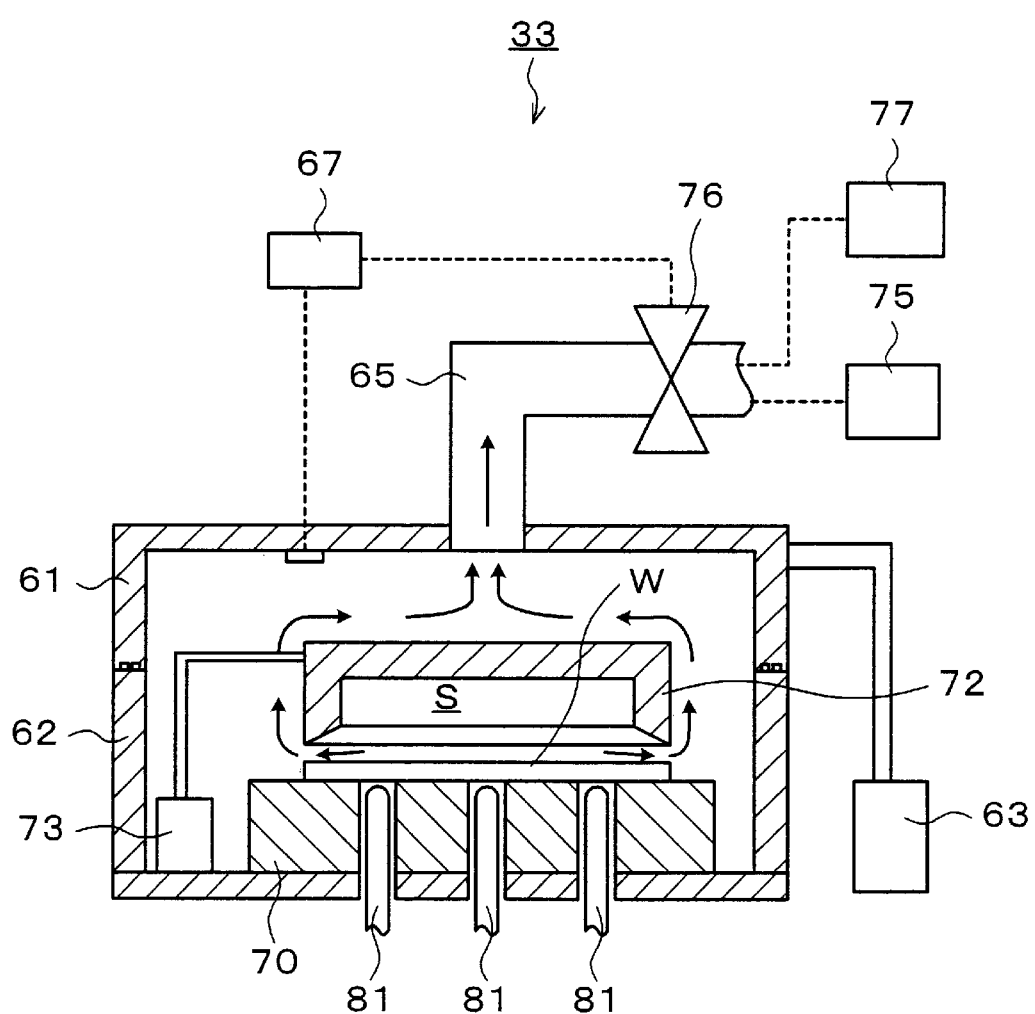
FIG. 5 is a state view of a vertical cross section of the reduced-pressure drying unit during processing of a wafer.

Then the lid body 61 is lowered by the lid body drive mechanism 63 as shown in FIG. 5, and the lower end portion of the lid body 61 closely comes into contact with the upper end portion of the container 62 to form the processing section S. The current plate 72 is also lowered by the drive mechanism 73 at that time so that the protrusion 72a of the current plate 72 is brought close to the peripheral portion of the wafer W.

Figure 6A:
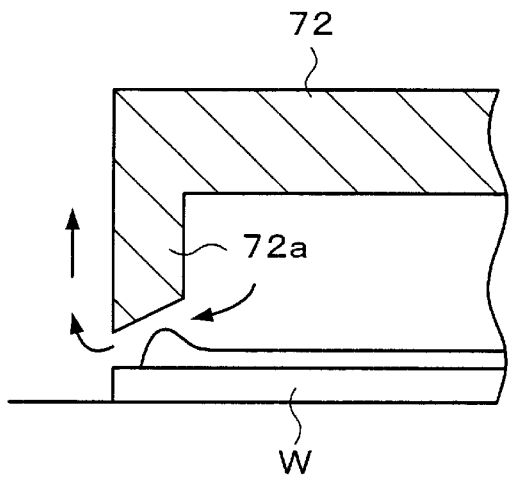
FIG. 6($a$) and FIG. 6($b$) are fragmentary explanatory view showing a manner in which a resist solution at a peripheral portion of the wafer is carried away by air current.
Figure 6B:
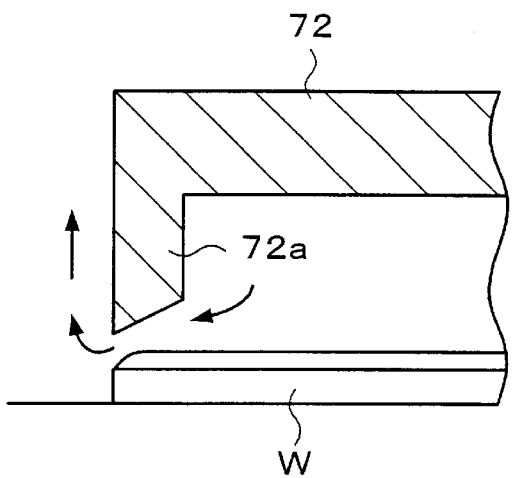
Figure 7:
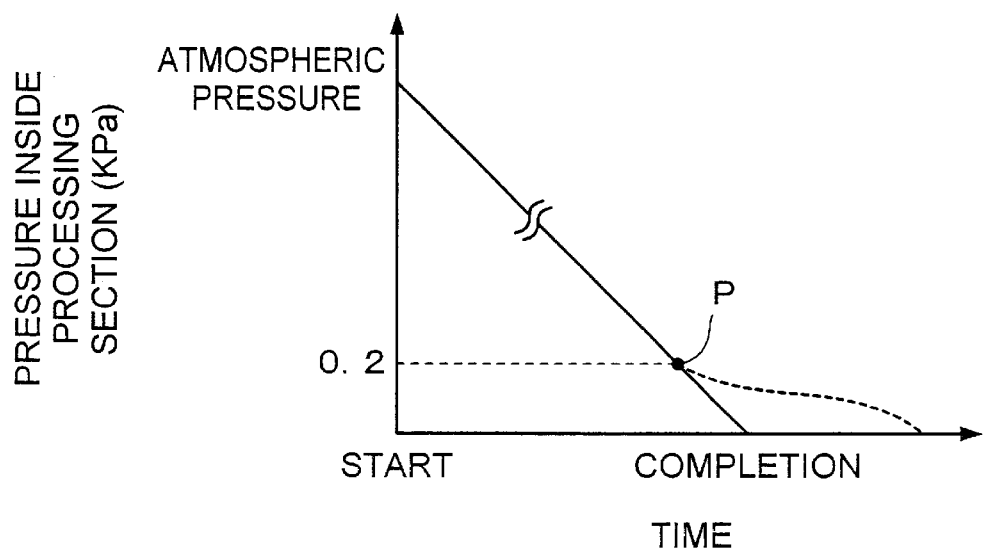
FIG. 7 is a graph indicating a change in pressure inside a processing section during drying processing under reduced pressure in the first embodiment.

Second, the suction unit 75 is operated to start sucking the gas inside the processing section S. In accordance with it, the air current is generated in the processing section S and drying of the wafer W is started. Moreover, a measurement of the pressure inside the processing section S is started by the pressure sensor 66 simultaneously with the start of drying. At this time, the valve 76 is gradually opened so that the pressure is reduced at a predetermined pressure reduction speed, for example, 2 KPa per second as shown in FIG. 7 in order to dry the resist solution gradually. By such suction, the air current, which radially flows from the center of the wafer W along the current plate 72, is generated on the top surface of the wafer W. In addition, since a flow path for the gas is narrowed by the protrusion 72a of the current plate 72 as described above, the current speed at the peripheral portion of the wafer W becomes higher compared with that at the center part of the wafer W. As a result, as shown in FIG. 6, when the resist solution having low viscosity is applied, the resist solution protruding at the peripheral portion of the wafer W by surface tension ((a) in FIG. 6) is carried away by the air current and becomes flat ((b) in FIG. 6).

If the pressure reduction is continued at the same pressure reduction speed as shown in FIG. 7, the solvent contained in the resist solution reaches the saturated vapor pressure, for example, 0.2 KPa (Point P in FIG. 7). If the state is left as it is at that time, the solvent is sharply vaporized, whereby the pressure reduction speed inside the processing section S is lowered and time required for drying is lengthened (the dotted line in FIG. 7). As described above, the pressure sensor 66 detects the set value 0.2 KPa which is set in advance and the signal is transmitted to the controller so that the degree of opening and closing of the valve 76 is increased. By virtue of this, the predetermined pressure reduction speed inside the processing section S is maintained, with the result that the drying speed of the wafer W is also maintained.

Drying under reduced pressure is subsequently performed thereafter, and after a lapse of a predetermined period of time, the suction unit 75 is brought to a stop and the valve 76 is closed so that drying processing under reduced pressure is completed. Subsequently, the nitrogen gas is supplied from the feeder 77 to the processing section S. At this time, the valve 76 is gradually opened to slowly perform recovery of the pressure inside the processing section S. Then the inside of the processing section S is purged by keeping on supplying the nitrogen gas thereto as well after the pressure therein recovers to atmospheric pressure. The lid body 61 is subsequently raised by the lid body drive mechanism 63 and the wafer W is delivered from the hoisting and lowering pins 81 to the main carrier unit 13 in the same manner as that when it is carried in.

According to the embodiment as has been described, a gap between the peripheral portion of the wafer W and the current plate 72 is narrowed at the protrusion 72a by providing the protrusion 72a corresponding to the peripheral portion of the wafer W on the underneath portion of the aforesaid current plate 72. As a result, the speed of the air current generated inside the processing section S by the reduced pressure is increased when it passes the gap. The air current carries away protuberance of the resist solution at the peripheral portion of the wafer W which is generated in coating treatment to make it flat so that the film thickness thereof becomes the same as that of the other portions of the wafer W. Accordingly, it is possible to remove the protuberance of the resist solution at the peripheral portion of the wafer W which is generated in the coating treatment, thereby forming a uniform resist film and improving yields.

Moreover, the air current, which flows-from the inside of the protrusion 72a of the current plate 72 along the top surface of the wafer W in a perimetric direction of the wafer W, is smoothly accelerated by beveling the lower end portion of the protrusion 72a and making the outside thereof larger than the inside thereof in protruding length. Consequently, the resist solution is prevented from being adversely affected by the occurrence of local pressure fluctuation or the like. Incidentally, the shape of the protrusion of the current plate 72 is not limited to the above-described shape, but the lower end portion thereof may be flat.

Further, the saturated vapor pressure of the solvent in the coating solution is set in the pressure sensor 66 in advance, and the degree of opening and closing of the valve 76 is increased through the use of the controller 67 when the pressure inside the processing section S reaches the set value by the pressure reduction. Although it is normally supposed that a large amount of solvent is vaporized and the pressure reduction speed in the processing section S is remarkably decreased to thereby lengthen the time required for drying, such situation can be prevented by virtue of the above method since the wafer W is dried under reduced pressure with the preceding pressure reduction speed maintained.

Furthermore, the wafer W on the mounting table 70 is maintained at a predetermined temperature over the entire face thereof by adding the temperature control function to the mounting table 70. As a consequence, the solvent in the resist solution is uniformly vaporized from the entire face of the wafer W, whereby the exceedingly uniform resist film is formed.

Moreover, the reduced pressure state inside the processing section S is gradually released by controlling the valve 76 to gradually supply the nitrogen gas by means of the feeder 77 after the drying processing. Consequently, it is inhibited that dust or the like existing in the processing section S is stirred up by the air current due to sudden rise in pressure and adheres to a substrate to become particles.

In addition, the valve 76 is used to release the reduced pressure state, whereby it is not necessary to separately attach a valve exclusive for leak. It should be noted that the same effect can be obtained if the tip of the exhaust duct 65, which is provided with the feeder 77, is made atmospheric open although the gas is actively supplied by providing the feeder 77 in the above embodiment.

Figure 8:
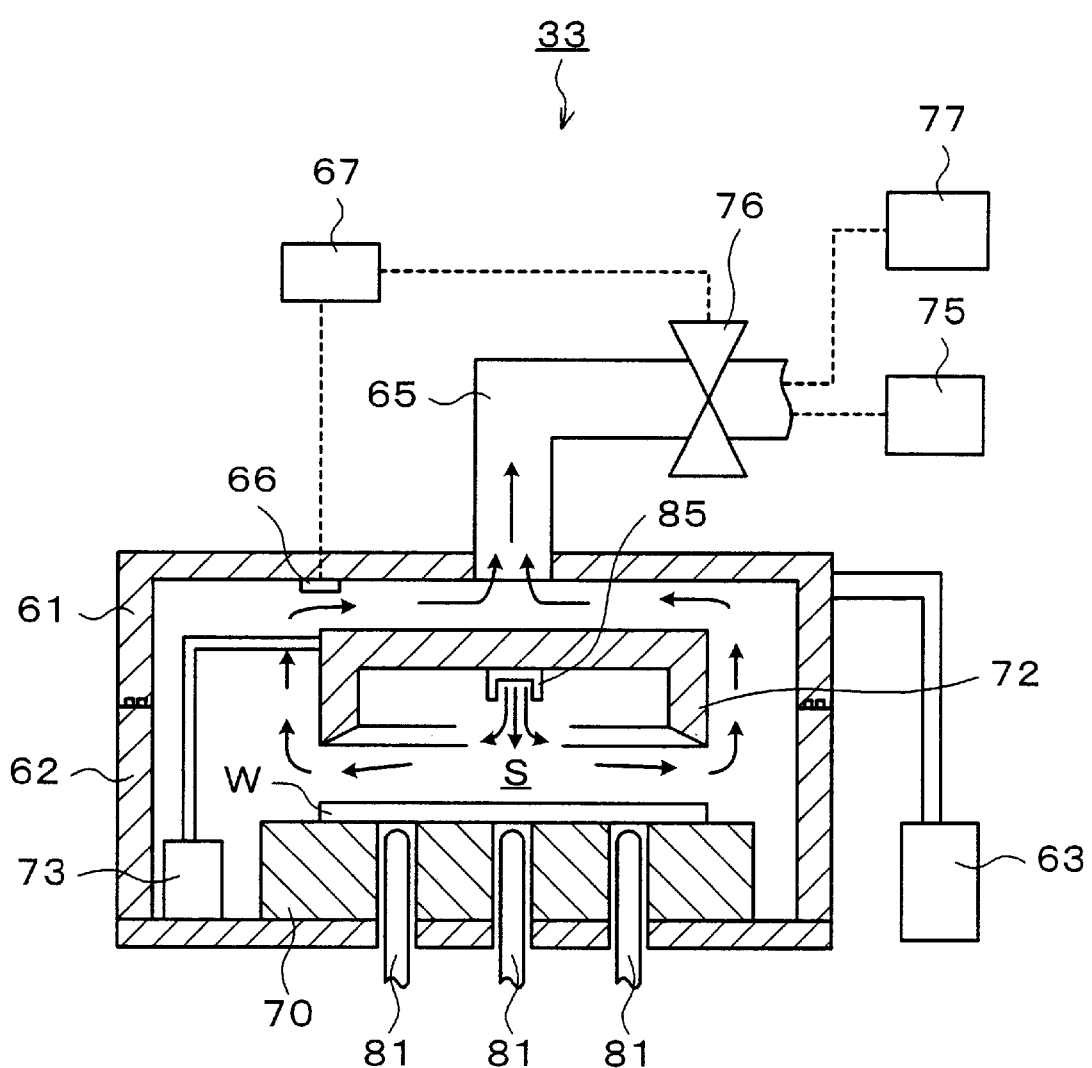
FIG. 8 is an explanatory view of a vertical cross section of the reduced-pressure drying unit in a case where a nozzle for supplying predetermined gas is attached to a current plate.

Here, for example, a nozzle 85 for supplying predetermined gas to a region surrounded by the protrusion 72a of the current plate 72 may be provided in the above embodiment, as shown in FIG. 8. The predetermined gas such as, for example, the nitrogen gas is actively supplied from the nozzle 85 during the processing, whereby it is possible to increase the current speed and more effectively remove the protuberance of the resist solution at the peripheral portion of the wafer W which is generated in the coating treatment.

Further, although the current plate 72 is not particularly moved vertically during the processing in the above-described embodiment, it may be moved vertically by the drive mechanism 73 during the processing. For example, the current plate 72 is brought close to the wafer W immediately after the start of the pressure reduction so that the protuberance of the resist solution is initially removed, and thereafter drying under reduced pressure is performed by slightly raising the current plate 72. As a consequence, it is possible to make the peripheral portion of the wafer W flat before drying of the resist solution proceeds and make the air current above the wafer W flow uniformly by raising the current plate 72 thereafter.

Furthermore, although the saturated vapor pressure of the solvent is set in the pressure sensor 66 in advance in the embodiment described above, an amount of change in pressure may be calculated based on the pressure measured by the pressure sensor 66 so that the degree of opening and closing of the valve 76 is made changed when the amount of change exceeds the predetermined value, instead. More specifically, a measured value by the pressure sensor 66 is transmitted to the controller 67 at any time and the amount of change in pressure in predetermined time is calculated in the controller 67. Then, when it exceeds an allowable value of the amount of change in pressure which is set in advance, the degree of opening and closing of the valve 76 is changed. Using this method is effective even in processing of which recipe is different, since the pressure reduction speed can be controlled only by the amount of change in pressure regardless of the saturated vapor pressure which varies corresponding to types of solvent.

Additionally, the degree of opening and closing of the valve 76 may be changed at predetermined timing which is set in advance, for example, at timing when the pressure reaches Point P in FIG. 7. It is necessary to find the timing beforehand by experiments or the like, and it can be easily performed with a relatively simple apparatus since complicated control is not required.

It should be noted that control of the pressure reduction speed in the processing section is performed by changing the degree of opening and closing of the valve 76 in the above embodiment, but it may be performed by other methods, for example, by controlling the suction unit 75.

Figure 9:
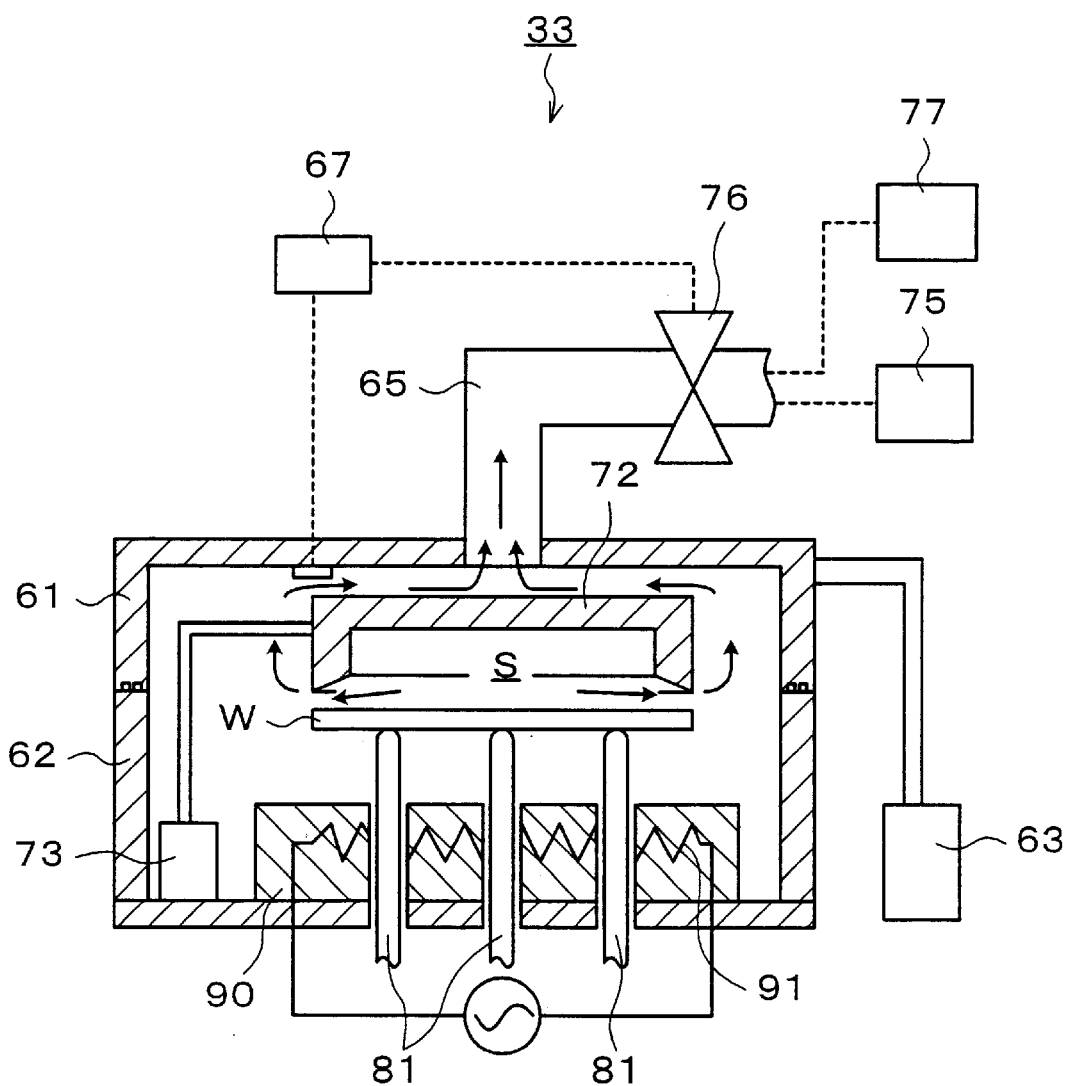
FIG. 9 is an explanatory view of a vertical cross section of a reduced-pressure drying unit according to a second embodiment.

Next, a case, in which the above-described reduced-pressure drying unit 33 in the first embodiment further has a heat treatment function, will be described as a second embodiment. As shown in FIG. 9, for example, a heating plate 90 on which the wafer W is placed and heated is provided in the chamber 60 and a heater 91 serving as a heat source of the heating plate 90 is made embedded in the heating plate 90. In addition, the heating plate 90 is structured so as to be capable of being heated to a predetermined temperature and maintained at the temperature. Processes of pressure reduction processing at this time are as follows. First the wafer W is carried into the chamber 60 and delivered to the hoisting and lowering pins 81 which are raised and keep waiting beforehand as in the first embodiment. Second, the wafer W is supported by the hoisting and lowering pins 81 and drying under reduced pressure similar to that in the first embodiment is performed on the wafer W with the wafer W raised. To be more specific, the lid body 61 is lowered while the wafer W remains supported by the hoisting and lowering pins 81 above the heating plate 90, to form the processing section S. Then the pressure inside the processing section S is reduced by the suction unit 75 after the current plate 72 is lowered, and drying under reduced pressure is performed on the wafer W.

When drying under reduced pressure is completed thereafter, the hoisting and lowering pins 81 which have supported the wafer W are lowered and the wafer W is placed on the heating plate 90 which is heated. Here, the wafer W is heated for predetermined time so that the solvent, which is not completely dried in the above-described drying processing under reduced pressure, is vaporized. Subsequently, the wafer W is raised by the hoisting and lowering pins 81 once again and delivered to the main carrier unit 13 as in the first embodiment.

Although such heat treatment is ordinarily performed in the prebaking unit 34, time required for carrying the wafer between the respective units or the like is shortened and a throughput can be improved by performing the prebaking in the reduced-pressure drying unit 33. In addition, it is not necessary to provide the prebaking unit 34 separately, whereby space can be correspondingly saved.

Figure 11:
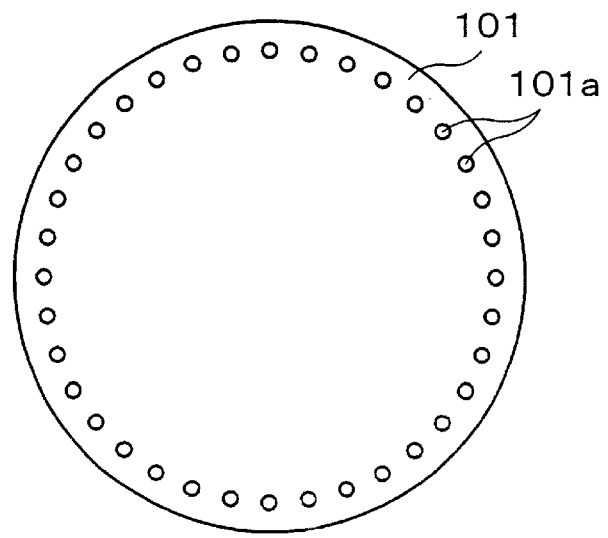
FIG. 11 is a plane view of a current plate employed in the reduced-pressure drying unit according to the third embodiment.
Figure 12:
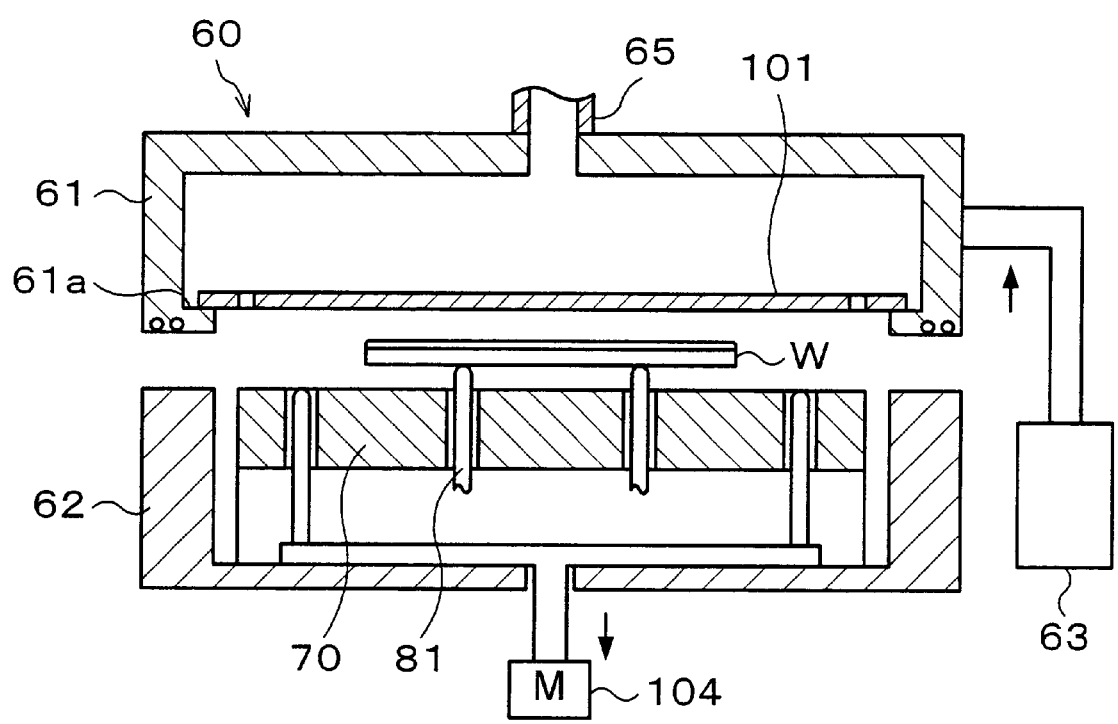
FIG. 12 is an explanatory view of a vertical cross section of a state when a lid body is raised in the reduced-pressure drying unit according to the third embodiment.

Next, a third embodiment will be explained. In an example shown in FIG. 10, the lid body 61, which forms the chamber 60, is provided with a ring-shaped projection 61a projecting inwardly, on the inner circumference of its lower end portion. A flat current plate 101 is employed in the third embodiment. Along the periphery of the current plate 101, formed are a large number of holes 101a as shown in FIG. 11. Although the holes 101a are formed arbitrarily, they are significant for smooth exhaust. The outer diameter of the current plate 101 is larger than the inner diameter of the ring-shaped projection 61a. Accordingly, the periphery of the current plate 101 is caught against the projection 61a of the lid body 61 when the lid body 61 is raised by the lid body drive mechanism 63, whereby lid body 61 can lift the current plate 101 if the lid body 61 is raised as it is as shown in FIG. 12.

Material having low thermal conductivity such as, for example, stainless steel, quartz glass, ceramic or the like is suitable for the current plate 101. Moreover, it is preferable that the underneath surface of the current plate 101 is made smooth by surface treatment. It is desirable that the underneath surface thereof is surfaced smooth so that, for example, surface roughness thereof becomes 0.2 $\mu$m or less.

On the periphery of the mounting table 70, provided are, for example, six supporting pins 102 capable of supporting the current plate 101. The supporting pins 102 are fixed on a bracket 103, and the bracket 103 is vertically moved by the drive of a drive mechanism 104. Therefore, the supporting pins 102 can project from the surface of the mounting table 70 or retract inside the mounting table 70.

Figure 10:
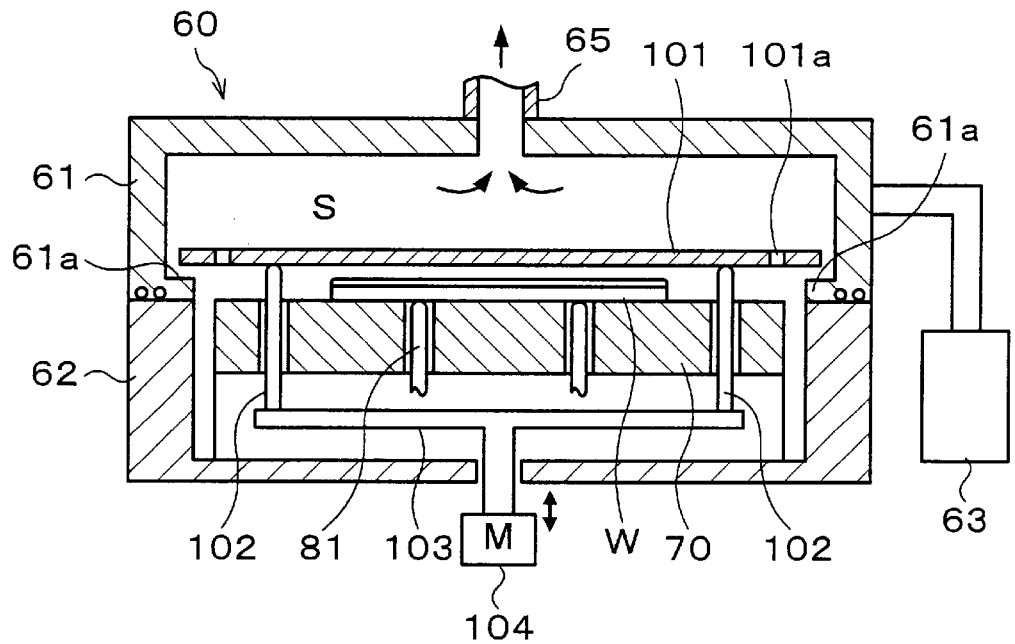
FIG. 10 is an explanatory view of a vertical cross section of a reduced-pressure drying unit according to a third embodiment.

In the third embodiment having the structure described above, the hoisting and lowering pins 81 are lowered and the wafer W is placed on the mounting table 70 when the resist solution on the wafer W is dried by reducing the pressure inside the processing section S, as shown in FIG. 10. Then also the lid body 61 is lowered to closely come into contact with the container 62. On the other hand, the supporting pins 102 are raised to support the current plate 101. At this time, a suitable distance between the underneath surface of the current plate 101 supported by the supporting pins 102 and the top surface of the wafer W, more specifically, the surface of the resist solution applied to the top surface of the wafer W is 0.5 mm to 2.0 mm.

Figure 13:
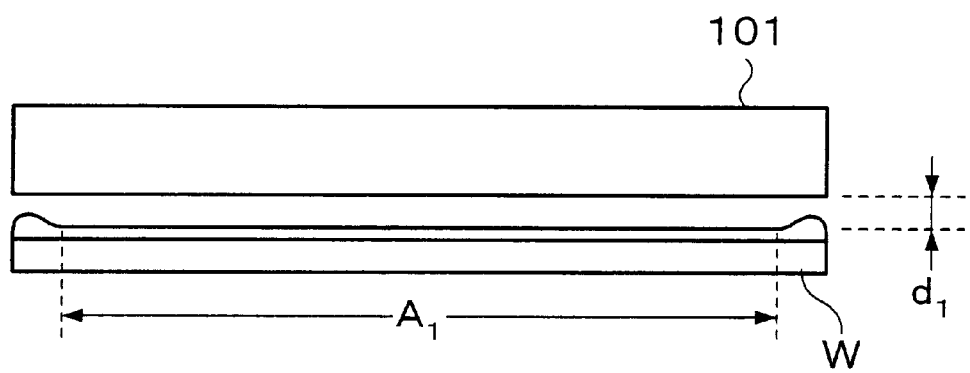
FIG. 13 is an explanatory view showing a state of a resist solution on the wafer when a gap between the current plate and the wafer is large.
Figure 14:
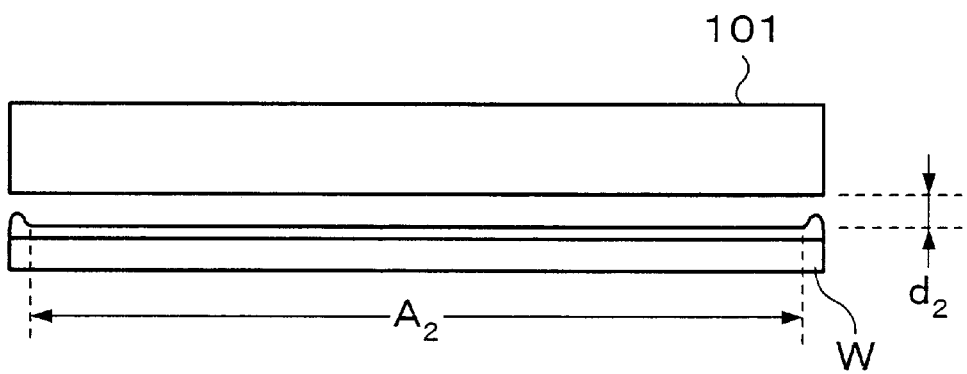
FIG. 14 is an explanatory view showing a state of a resist solution on the wafer when a gap between the current plate and the wafer is small.

Additionally, it is determined that an area "A", of which film thickness is uniform on the surface of the resist solution applied on the wafer W, becomes larger if a distance "d1" between the underneath surface of the current plate 101 and the top surface of the wafer W shown in FIG. 13 is set for "d2" which is a shorter distance therebetween as shown in FIG. 14 during drying under reduced pressure, according to experiments by the inventors. That is, an area "A2" in FIG. 14 is larger than an area "A1" shown in FIG. 13. In other words, a width of the protuberance of the resist solution at the peripheral portion of the wafer W becomes smaller in the case in FIG. 14 than in the case in FIG. 13. Accordingly, the size of an area of a portion which is uniform in film thickness of the resist solution can be controlled by adjusting the distance between the underneath surface of the current plate 101 and the top surface of the wafer W.

Further, if the underneath surface of the current plate 101 is made smooth by the surface treatment as described above, it is possible to prevent turbulence from occurring in a space between the underneath surface of the current plate 101 and the top surface of the wafer W, thereby making also the surface of the resist solution applied on the wafer W flatter.

Since holes 101a are formed along the periphery of the current plate 101, the air current flowing from the underneath surface of the current plate 101 toward the exhaust duct 65 flows smoothly. Additionally, the current plate 101 itself is supported by the supporting pins 102, whereby parallelism of the current plate 101 and the wafer W can be more precisely and readily set. It is easy to adjust the parallelism by making fine adjustments of, for example, the level of the supporting pins 102 from the bracket 103. By maintaining the current plate 101 and the wafer W exactly parallel in this manner, it is possible to make the film thickness of the resist solution applied on the wafer W uniform.

When drying under reduced pressure is completed, the current plate 101 is caught against the projection 61a on the inner circumference of the lid body 61 and lifted as it is if the lid body 61 is raised by the drive of the lid body drive mechanism 63 as shown in FIG. 12. Meanwhile, the supporting pins 102 are lowered, and alternatively the hoisting and lowering pins 81 are raised. As a consequence, the wafer W is lifted from the mounting table 70 by the hoisting and lowering pins 81 to be in a state where it can be taken out by a carrier arm or the like.

Figure 15:
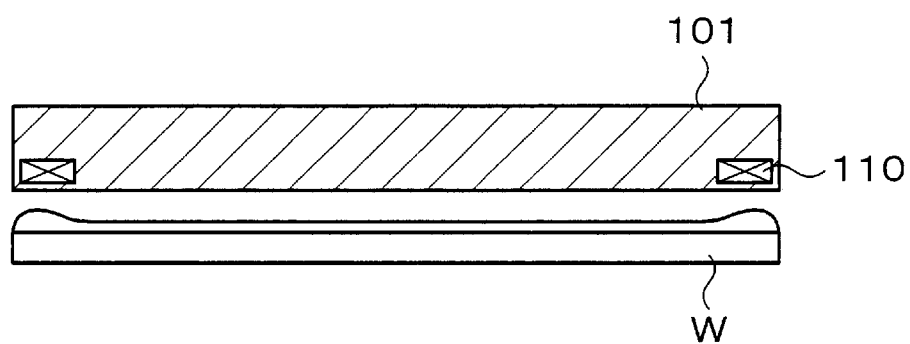
FIG. 15 is a side sectional view of the current plate having a heating device inside of a peripheral portion thereof.
Figure 16:
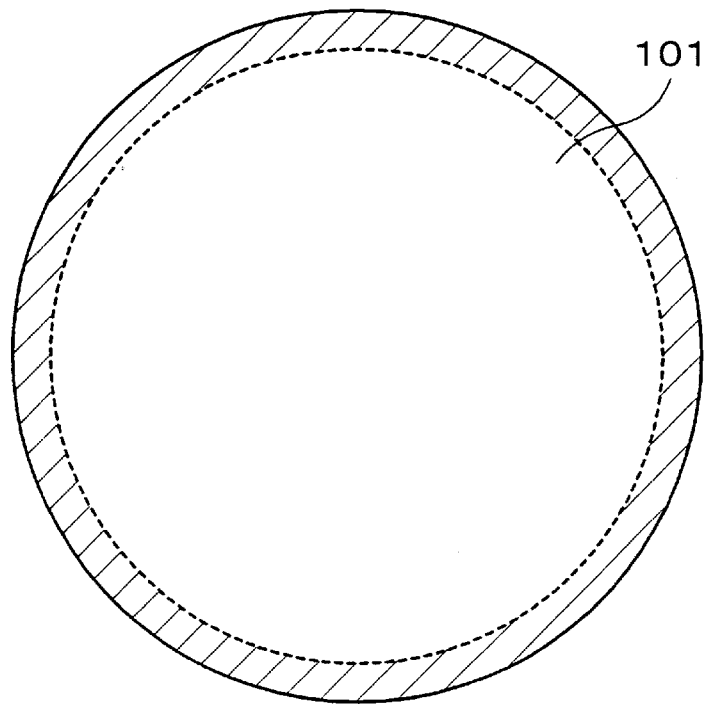
FIG. 16 is a bottom view of the current plate of which peripheral portion has a deep color.

As shown in FIG. 15, a ring-shaped heater 110 may be provided on the peripheral portion of the current plate 101. Although the heater 110 is embedded in the current plate 101 in an example in FIG. 15, the heater 110 may be attached to the underneath surface side or the upper surface side of the current plate 101. By heating the peripheral portion of the current plate 101 by means of the heater 110, the peripheral portion of the wafer W is heated with radiant heat generated at that moment and volatility of the solvent in the resist solution can be promoted. As a result, the height of the protruding portion of the resist solution at the peripheral portion of the wafer W is decreased, whereby the resist film which is more uniform as a whole can be formed on the wafer W when drying under reduced pressure is performed.

In place of attaching the heater 110, the color of the peripheral portion of the underneath surface of the current plate may be made to a color having lightness lower than that of the other portions thereof, that is, a deep color. For example, black is a representative deep color. Since radiation is correspondingly active in a portion of the deep color, radiant heat is dissipated from the peripheral portion thereof when the current plate 101 bears heat, whereby the peripheral portion of the wafer W is heated so that volatility of the solvent in the resist solution can be promoted.

Although the previously described embodiments are on the wafer processing unit after the coating treatment in the photolithography in the processes of semiconductor wafer device fabrication, the present invention is also applicable to a processing unit of a substrate other than the semiconductor wafer such as, for example, an LCD substrate.

Additionally, the above-described embodiments have been disclosed with the intention of clarifying technical meaning of the present invention. Therefore, it is to be understood that the present invention is not intended to be limited to the above embodiments, and various changes may be made therein without departing from the spirit of the present invention and within the meaning of the claims.

What is claimed is:

1. A substrate processing unit for performing predetermined processing on a substrate in a processing section after applying a coating solution to the substrate comprising:

exhaust means for reducing a pressure inside said unit;

a current plate for rectifying air current generated in the processing section due to exhaust by said exhaust means, which is arranged above the substrate, an underneath surface of said current plate having a protrusion which protrudes downward compared with other portions thereof corresponding to an outer peripheral portion of the substrate and the protrusion is disposed right above the outer peripheral portion of the substrate.

2. A unit according to claim 1, wherein a lower end surface of the protrusion of said current plate is bevel and the outside of the protrusion is larger than the inside thereof in protruding length.

3. A unit according to claim 1, further comprising gas supply means for supplying predetermined gas to a region surrounded by the protrusion of said current plate.

4. A unit according to claim 1, wherein said current plate is vertically movable.

5. A unit according to claim 1, further comprising a mounting table on which the substrate is placed in the processing section, and temperature control means capable of controlling a temperature of said mounting table.

6. A unit according to claim 1, further comprising a heating plate on which the substrate is placed and heated in the processing section, and a hoisting and lowering member for supporting the substrate to raise and lower it.

7. A unit according to claim 1, further comprising pressure measuring means for measuring a pressure inside the processing section, said exhaust means being structured so as to change pressure reduction speed in the processing section based on a measured value to of the pressure measured by said pressure measuring means.

8. A unit according to claim 1, further comprising pressure measuring means for measuring a pressure inside the processing section, an exhaust duct connecting to said exhaust means, which is provided in said processing unit, and a valve capable of opening and closing said exhaust duct, a degree of opening and closing of said valve being changeable based on a measured value of the pressure measured by said pressure measuring means.

9. A unit according to claim 1, wherein the predetermined processing is drying processing of a treatment solution on the substrate.

10. A unit according to claim 1, wherein the coating solution is a resist solution.

11. A substrate processing unit for performing predetermined processing on a substrate in a processing section after applying a coating solution to the substrate comprising:

exhaust means for reducing a pressure inside said unit;

a current plate for rectifying air current generated in the processing section due to exhaust by said exhaust means, which is arranged above the substrate, an underneath surface of said current plate having a protrusion which protrudes downward compared with other portions thereof corresponding to an outer peripheral portion of the substrate, and the protrusion is disposed right above the outer peripheral portion of the substrate, and a heating device for heating a peripheral portion of said current plate.

12. A substrate processing unit for performing predetermined processing on a substrate in a processing section after applying a coating solution to the substrate comprising:

exhaust means for reducing a pressure inside said unit; and a current plate for rectifying air current generated in the processing section due to exhaust by said exhaust means, which is arranged above the substrate, an underneath surface of said current plate having a protrusion which protrudes downward compared with other portions thereof corresponding to an outer peripheral portion of the substrate, and the protrusion is disposed right above the outer peripheral portion of the substrate, and a peripheral portion of an underneath surface of said current plate having a color which is lower in lightness than that of other portions thereof.

* * * * *